(12) United States Patent
Chen et al.

(10) Patent No.: US 8,492,852 B2
(45) Date of Patent: Jul. 23, 2013

(54) INTERFACE STRUCTURE FOR CHANNEL MOBILITY IMPROVEMENT IN HIGH-K METAL GATE STACK

(75) Inventors: Tze-Chiang Chen, Yorktown Heights, NY (US); Dechao Guo, Wappingers Falls, NY (US); Philip J. Oldiges, Larangeville, NY (US); Yanfeng Wang, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 392 days.

(21) Appl. No.: 12/792,242

(22) Filed: Jun. 2, 2010

(65) Prior Publication Data
US 2011/0298060 A1    Dec. 8, 2011

(51) Int. Cl.
*H01L 21/02* (2006.01)
*H01L 21/31* (2006.01)
*H01L 21/469* (2006.01)

(52) U.S. Cl.
USPC ........... 257/411; 257/310; 257/410; 438/778; 438/783; 438/785

(58) Field of Classification Search
None
See application file for complete search history.

(56) References Cited

U.S. PATENT DOCUMENTS

| | | | |
|---|---|---|---|
| 6,320,238 B1 | 11/2001 | Kizilyalli et al. | |
| 6,511,876 B2 | 1/2003 | Buchanan et al. | |
| 6,621,114 B1 | 9/2003 | Kim et al. | |
| 6,977,194 B2 | 12/2005 | Belyansky et al. | |
| 7,115,959 B2 | 10/2006 | Andreoni et al. | |
| 7,598,545 B2 | 10/2009 | Cartier et al. | |
| 7,648,868 B2 | 1/2010 | Majumdar et al. | |
| 2008/0261368 A1 | 10/2008 | Ramin et al. | |
| 2009/0039439 A1 | 2/2009 | Ramin et al. | |
| 2009/0085175 A1* | 4/2009 | Clark et al. | 257/637 |
| 2009/0152636 A1 | 6/2009 | Chudzik et al. | |
| 2010/0038725 A1 | 2/2010 | Chudzik et al. | |
| 2010/0148280 A1* | 6/2010 | Mitsuhashi | 257/410 |

FOREIGN PATENT DOCUMENTS

WO    2010047013 A1    4/2010

OTHER PUBLICATIONS

X.P. Wang et al., Physical and electrical characteristics of high-k gate dielectric Hf(1-x)LaxOy, 2006, Solid-State Electronics, vol. 50, pp. 986-991.*

X.P. Wang et al., "Physical and Electrical Characteristics of High-K Gate Dielectric Hf(1-x) LaxOy," Solid-State Electronics; vol. 50, No. 6; pp. 986-991; 2006.

(Continued)

*Primary Examiner* — Michael Lebentritt
*Assistant Examiner* — Aaron Dehne
(74) *Attorney, Agent, or Firm* — Cantor Colburn LLP; Vazken Alexanian

(57) ABSTRACT

A gate stack structure for field effect transistor (FET) devices includes a nitrogen rich first dielectric layer formed over a semiconductor substrate surface; a nitrogen deficient, oxygen rich second dielectric layer formed on the nitrogen rich first dielectric layer, the first and second dielectric layers forming, in combination, a bi-layer interfacial layer; a high-k dielectric layer formed over the bi-layer interfacial layer; a metal gate conductor layer formed over the high-k dielectric layer; and a work function adjusting dopant species diffused within the high-k dielectric layer and within the nitrogen deficient, oxygen rich second dielectric layer, and wherein the nitrogen rich first dielectric layer serves to separate the work function adjusting dopant species from the semiconductor substrate surface.

30 Claims, 8 Drawing Sheets

OTHER PUBLICATIONS

International Search Report; International Application No. PCT/EP2011/058086; International Filing Date: May 18, 2011; Date Mailed: Sep. 6, 2011.

International Search Report—Written Opinion; International Application No. PCT/EP2011/058086; International Filing Date: May 18, 2011; Date Mailed: Sep. 6, 2011.

* cited by examiner

INTERFACE STRUCTURE FOR CHANNEL MOBILITY IMPROVEMENT IN HIGH-K METAL GATE STACK

BACKGROUND

The present invention relates generally to semiconductor device manufacturing and, more particularly, to an interface structure for channel mobility improvement in high-k metal gate stacks.

In standard complementary metal oxide semiconductor (CMOS) devices, polysilicon is typically used as the gate material. The technology of fabricating CMOS devices using polysilicon gates has been in a constant state of development, and is now widely used in the semiconductor industry. One advantage of using polysilicon gates is that they can sustain high temperatures. However, there are also some problems associated with using a polysilicon gate. For example, due to the poly-depletion effect, polysilicon gates commonly used in CMOS devices are becoming a gating factor in chip performance for channel lengths of 0.1 micron and below. Another problem with polysilicon gates is that the dopant material in the polysilicon gate (e.g., boron) can easily diffuse through the thin gate dielectric, causing further degradation of the device performance. Thus, one proposed way of improving the performance of sub-micron transistors is to use metal gates in place of conventional polysilicon gates, particularly with the advent of high-k gate dielectric materials.

While replacing traditional polysilicon gates with metal or metal alloy gate electrodes eliminates the polysilicon depletion effect, there are problems associated with the use of metal gates and high-k gate dielectric including, for example, high threshold voltage ($V_t$) due to Fermi-level pinning effect. The threshold voltage is the gate voltage value required to render the channel conductive by formation of an inversion layer at the surface of the semiconductor channel. For enhancement-mode (e.g., normally off) devices, $V_t$ is positive for NFET devices and negative for PFET devices. The threshold voltage is dependent upon the flat-band voltage, which in turn depends on the work function difference between the gate and the substrate materials, as well as on surface charge.

The work function of a material is a measure of the energy required to move an electron in the material outside of a material atom from the Fermi level, and is usually expressed in electron volts (eV). For CMOS devices, it is desirable to provide stable threshold voltages for the NFETs and PFETs. To establish $V_t$ values, the work functions of the NFET and PFET gate contact and the corresponding channel materials are independently tuned or adjusted. Such work function values may be, for example, about 4.1 and 5.2 electron volts (eV) for the n-and p-channel electrodes, respectively. Accordingly, gate stack engineering is employed to adjust the work function of the gate contact materials, where different gate work function values are established for NFET and PFET gates.

SUMMARY

In an exemplary embodiment, a gate stack structure for field effect transistor (FET) devices includes a nitrogen rich first dielectric layer formed over a semiconductor substrate surface; a nitrogen deficient, oxygen rich second dielectric layer formed on the nitrogen rich first dielectric layer, the first and second dielectric layers forming, in combination, a bi-layer interfacial layer; a high-k dielectric layer formed over the bi-layer interfacial layer; a metal gate conductor layer formed over the high-k dielectric layer; and a work function adjusting dopant species diffused within the high-k dielectric layer and within the nitrogen deficient, oxygen rich second dielectric layer, and wherein the nitrogen rich first dielectric layer serves to separate the work function adjusting dopant species from the semiconductor substrate surface.

In another embodiment, a high-k metal gate stack structure for field effect transistor (FET) devices includes a nitrogen rich first dielectric layer formed over a semiconductor substrate surface; a nitrogen deficient, oxygen rich second dielectric layer formed on the nitrogen rich first dielectric layer, the first and second dielectric layers forming, in combination, a bi-layer interfacial layer; a hafnium based, high-k dielectric layer formed over the bi-layer interfacial layer; a metal gate conductor layer formed over the high-k dielectric layer; and a lanthanum dopant species diffused within the high-k dielectric layer and within the nitrogen deficient, oxygen rich second dielectric layer, forming a high-k lanthanum oxide therein, and wherein the nitrogen rich first dielectric layer serves to separate the high-k lanthanum oxide from the semiconductor substrate surface.

In another embodiment, a method of forming gate stack structure for field effect transistor (FET) devices includes forming a nitrogen rich first dielectric layer over a semiconductor substrate surface; forming a nitrogen deficient, oxygen rich second dielectric layer on the nitrogen rich first dielectric layer, the first and second dielectric layers defining, in combination, a bi-layer interfacial layer; forming a high-k dielectric layer over the bi-layer interfacial layer; forming a metal gate conductor layer over the high-k dielectric layer; and diffusing a work function adjusting dopant species within the high-k dielectric layer and within the nitrogen deficient, oxygen rich second dielectric layer, and wherein the nitrogen rich first dielectric layer serves to separate the work function adjusting dopant species from the semiconductor substrate surface.

BRIEF DESCRIPTION OF THE SEVERAL VIEWS OF THE DRAWINGS

Referring to the exemplary drawings wherein like elements are numbered alike in the several Figures.

DETAILED DESCRIPTION

Figure 1A:
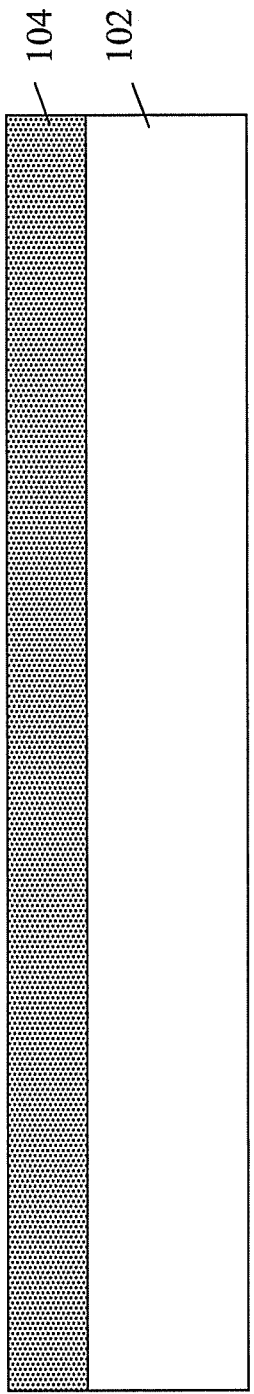
FIGS. 1(a) through 1(f) are a series of cross-sectional views illustrating an exemplary method of forming an interfacial layer structure for high-k FET gate stacks, in accordance with an embodiment of the invention.

As indicated above, various gate stack engineering techniques are employed for adjusting the work function of high-k metal gate (HKMG) structures. For example, a lanthanide species material such as lanthanum (La) or lutetium (Lu) may be deposited after an interfacial layer and a high-k layer(s) are formed over a semiconductor substrate. The interfacial layer is typically a lower-k dielectric layer, such as a silicon oxide, silicon nitride or a silicon oxynitride layer, for example, (whether formed in a specific step or as a byproduct of the high-k layer formation) and serves to separate the high-k layer from the channel region formed in the substrate. This is desirable since high-k dielectric materials typically have a high defect density, relative to oxide. Because these defects create charge trapping sites that impede charge carrier mobility, the presence of an interfacial layer separates the high-k layer from the channel region.

After deposition of the lanthanide species material, a thermal process, such as an annealing step, is then used to drive the lanthanide species down toward the interfacial layer. This diffusion serves to both (1) lower $V_t$ in NFET devices and (2) achieve inversion thickness ($T_{inv}$) scaling by increasing the interfacial layer dielectric constant. On the other hand, this diffusion also serves to decrease carrier mobility in the channel as the soft optical phonon effect associated with (for example) $La_xO_y$ in the conventionally formed interfacial layer is close to (or even in contact with) the semiconductor surface. Although carrier mobility can be improved by thickening the interfacial layer and decrease the thickness of the high-k layer in order to attain $T_{inv}$ scaling, this comes at the expense of high gate tunneling currents. As a result, in order to maintain the gate leakage benefit from high-k dielectrics, maintaining the $T_{inv}$ scaling and $V_t$ reduction benefits from species like La, Lu, but without carrier mobility degradation, new solutions are needed.

Accordingly, disclosed herein is a novel interfacial layer structure for high-k FET gate stacks that maintains $T_{inv}$ scaling and $V_t$ reduction benefits, but that also lowers or even eliminates the carrier mobility degradation. In brief, the interfacial layer is a bi-layer that includes a nitrogen rich first layer adjacent to the semiconductor surface, and a nitrogen deficient, oxygen rich second layer formed on the N-rich first layer. Thus formed, a diffused lanthanide species for $T_{inv}$ scaling and $V_t$ reduction is kept a sufficient distance from the inversion channel, thereby improving the carrier mobility.

Referring initially to FIGS. 1(a) through 1(f), there is shown a series of cross-sectional views illustrating an exemplary method of forming an interfacial layer structure for high-k FET gate stacks, in accordance with an embodiment of the invention. Beginning in FIG. 1(a), the channel surface of a semiconductor substrate 102 has a thin, nitrogen rich first dielectric layer 104 formed directly thereon, such as by growing or deposition, at an exemplary thickness of about 10 to about 20 angstroms (Å). The substrate 102 may include any suitable semiconducting material such as, but not limited to: silicon (Si), germanium (Ge), silicon germanium (SiGe), silicon carbide (SiC), silicon germanium carbide (SiGeC), gallium arsenide (GaAs), gallium nitride (GaN), indium arsenide (InAs), indium phosphide (InP) and all other III/V or II/VI compound semiconductors. The semiconductor substrate 102 may also comprise an organic semiconductor or a layered semiconductor such as Si/SiGe, a silicon-on-insulator (SOI), a SiGe-on-insulator (SGOI) or germanium-on-insulator (GOI). The first dielectric layer 104 may include for example, silicon nitride (SiN) or silicon oxynitride (SiON).

Figure 1B:
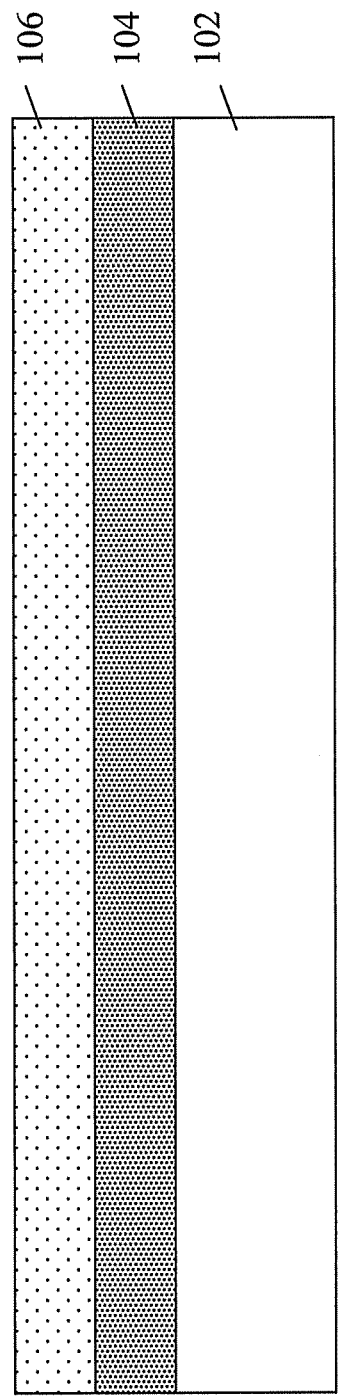

Then, as shown in FIG. 1(b), a nitrogen deficient second dielectric layer 106 is formed over the nitrogen rich first dielectric layer 104, such as by deposition, for example, at an exemplary thickness of about 10 Å. The nitrogen deficient second dielectric layer 106 may be, for example, an ozone layer or an oxide layer. Thus formed, the nitrogen rich first dielectric layer 104 and the nitrogen deficient second dielectric layer 106 define an interfacial layer 108.

Figure 1C:
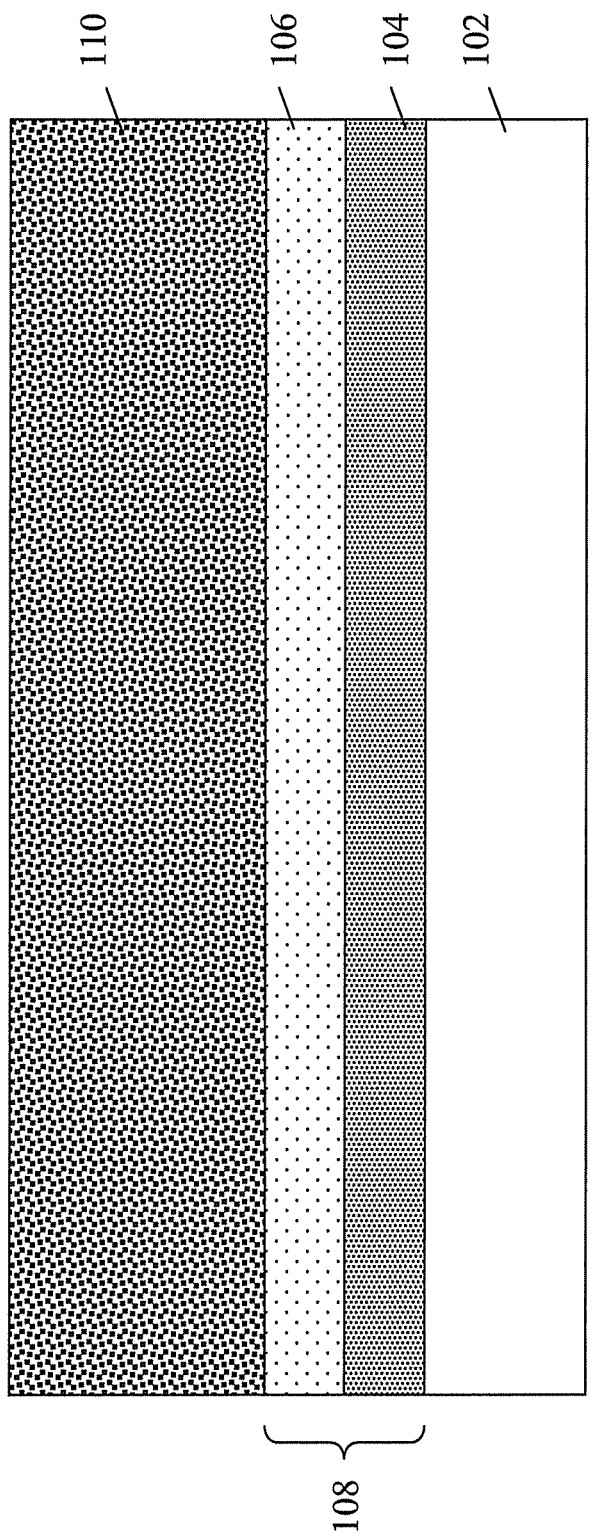

Referring next to FIG. 1(c), in one embodiment, the completion of the interfacial layer 108 is followed by formation of a high-k gate dielectric layer 110. As used herein, the term "high-k" generally denotes an insulator having a dielectric constant of greater than about 4.0, and more specifically greater about than 7.0. The high-k gate dielectric layer 110 may be, for example, a hafnium (Hf) based layer. More specific examples of suitable high-k dielectric layers may include, but are not limited to: hafnium oxide ($HfO_2$), hafnium orthosilicate ($HfSiO_4$), zirconium dioxide ($ZrO_2$), aluminum oxide ($Al_2O_3$), titanium dioxide ($TiO_2$), lanthanum oxide ($La_2O_3$), strontium titanate ($SrTiO_3$), lanthanum aluminate ($LaAlO_3$), cerium oxide ($CeO_2$), yttrium oxide ($Y_2O_3$) and combinations thereof. The thickness of the high-k gate dielectric layer 110 may be dependent on specific requirements with respect to gate tunneling current.

Figure 1D:
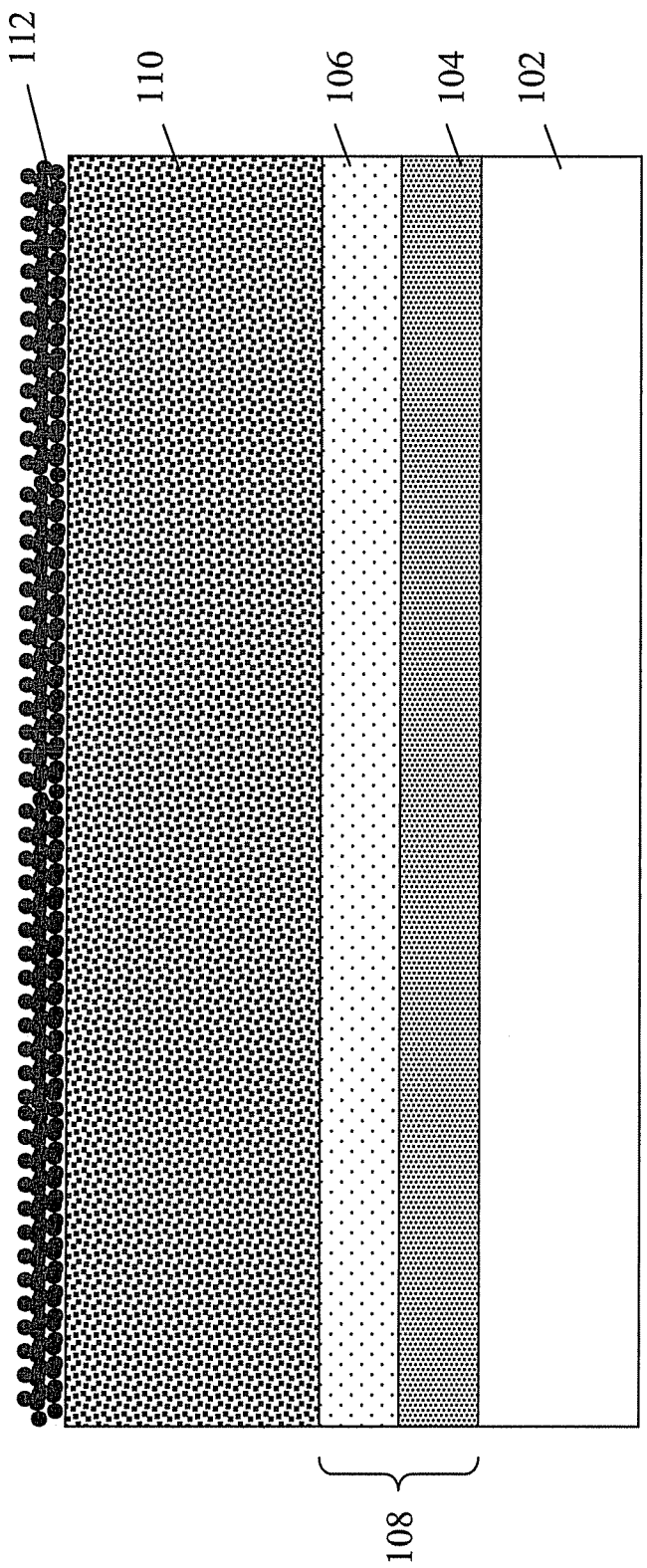
Figure 1E:
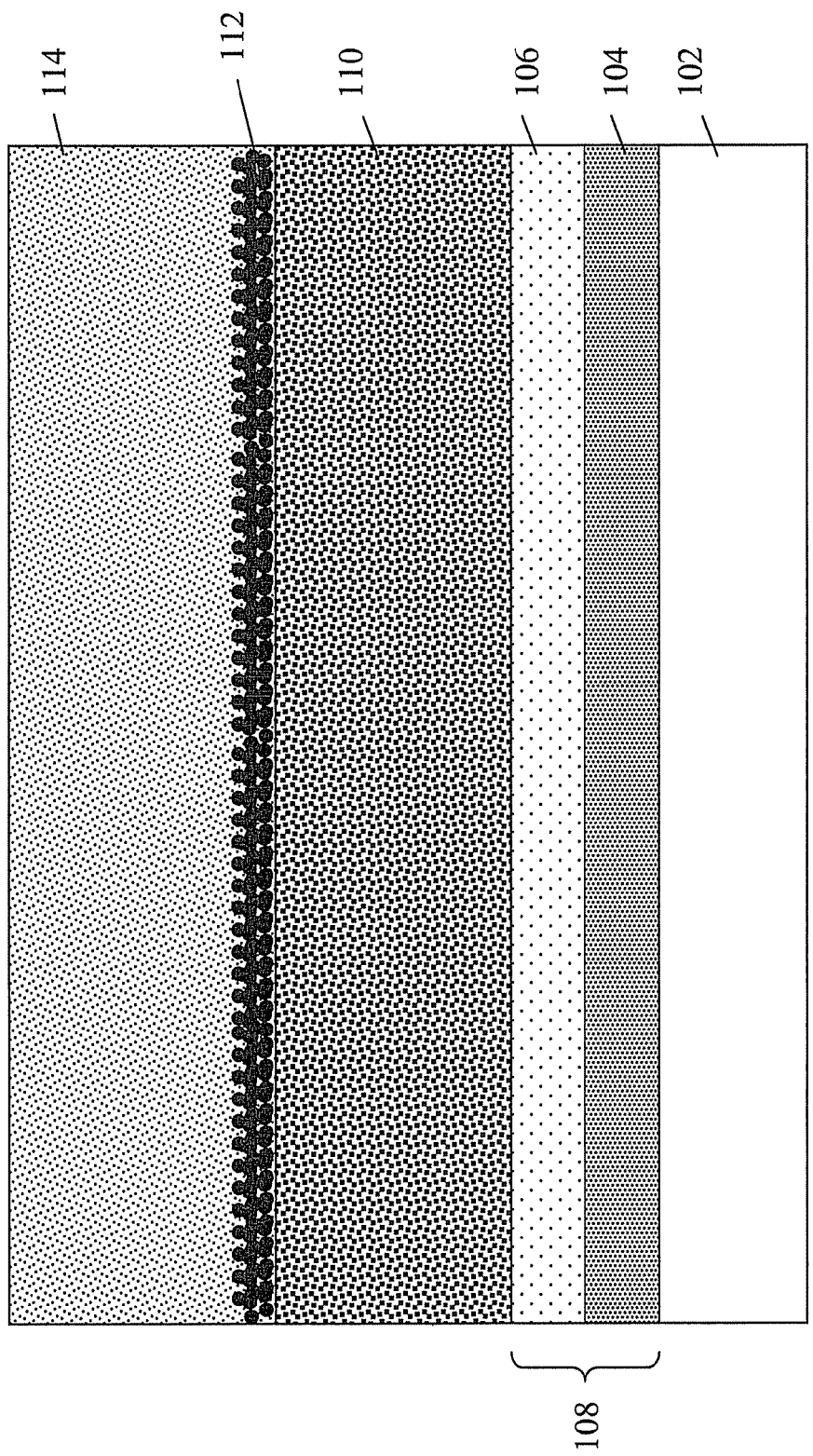

As then shown in FIG. 1(d), a work function adjusting dopant species 112, such a lanthanide species, is deposited on the high-k gate dielectric layer 110. The species 112 may include, for example, a lanthanide series metal such as lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) or lutetium (Lu). Other non-lanthanide series materials such as hafnium (Hf), for example, may also be used as the work function adjusting dopant species 112. In accordance with a gate first process flow, a suitable metal gate conductor layer 114 or layer, and any associated capping layers (not shown) are then formed over the dopant species 112 and high-k gate dielectric layer 110 as shown in FIG. 1(e). The metal gate conductor layer 114 may include, for example, elemental metals such as tungsten (W), tantalum (Ta), aluminum (Al), ruthenium (Ru), platinum (Pt), etc. or any electrically conductive compound including, but not limited to titanium nitride (TiN), tantalum nitride (TaN), nickel silicide (NiSi), nickel-platinum silicide (NiPtSi), titanium nitride (TiN), tantalum nitride (TaN), titanium carbide (TiC), tantalum carbide (TaC), tantalum carbide oxynitride (TaCNO), ruthenium oxide ($RuO_2$), etc., combinations and multi-layers thereof.

Figure 1F:
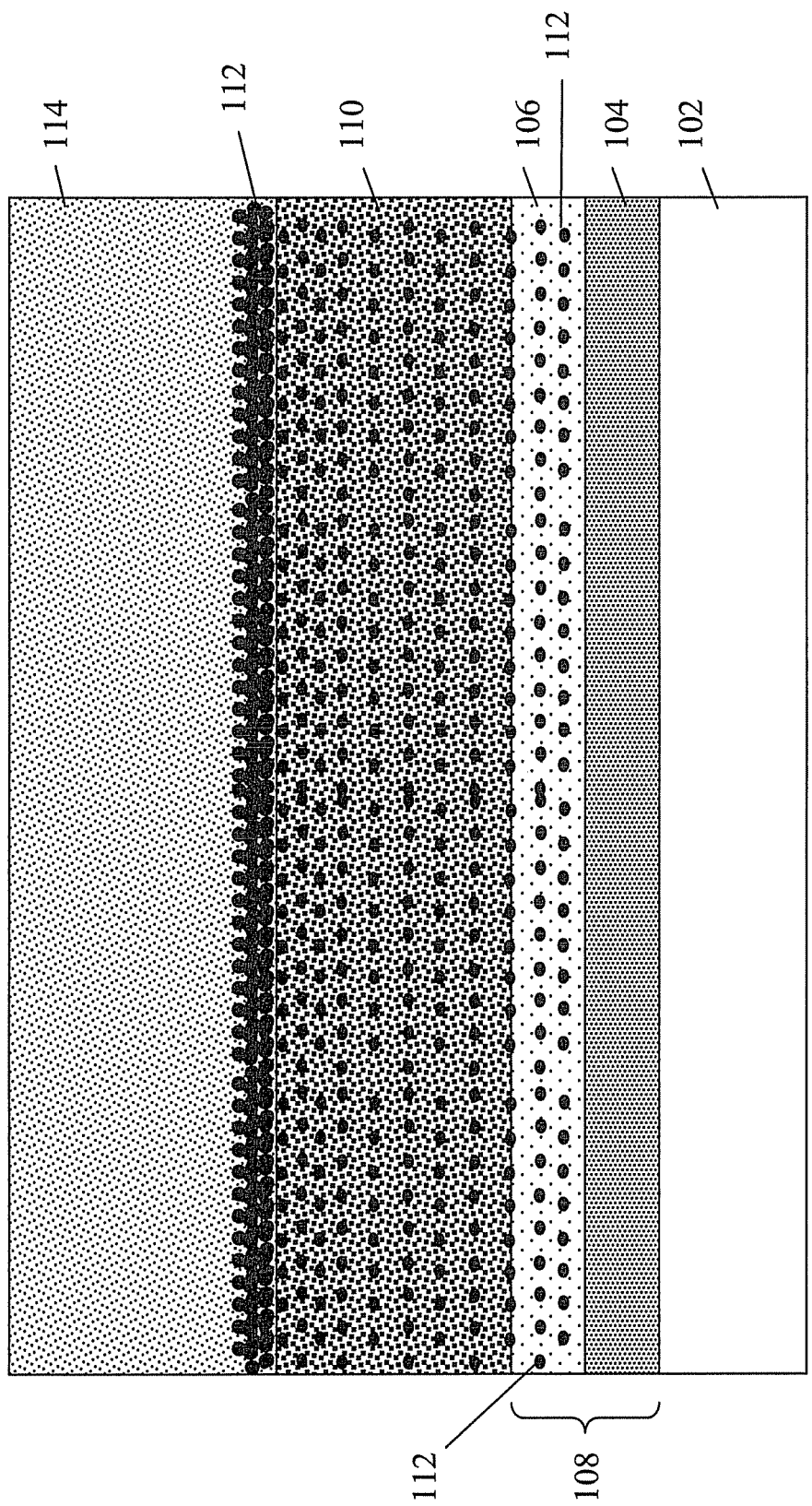

In FIG. 1(f), the resulting gate stack structure is subjected to a thermal process that diffuses the species 112 down to the nitrogen deficient second dielectric layer 106 to achieve $T_{inv}$ scaling and $V_t$ reduction for NFET devices. In particular, the diffused species creates charge dipoles between the top of the second dielectric layer 106 and the high-k dielectric layer 110 such that the effective work function can be adjusted for low-$V_t$ NFET applications. However, the species 112 is contained within the nitrogen deficient second dielectric layer 106, and not within the nitrogen rich first dielectric layer 104, thereby keeping the species 112 a sufficient distance away from the inversion channel formed in the substrate 102. In one exemplary embodiment, the high-k dielectric layer 110 is hafnium based, the dopant species is lanthanum, and the annealing operation results in the formation of high-k lanthanum oxide ($La_2O_3$) within the nitrogen deficient, oxygen rich second dielectric layer 106. As a result, the $T_{inv}$ scaling and $V_t$ reduction is not tempered by carrier mobility reduction.

Figure 2A:
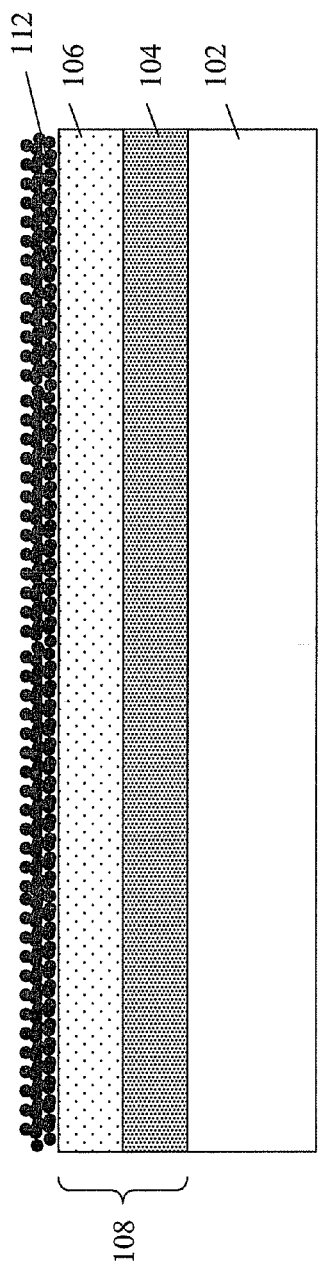
FIGS. 2(a) through 2(d) are a series of cross-sectional views illustrating an exemplary method of forming an interfacial layer structure for high-k FET gate stacks, in accordance with an alternative embodiment of the invention.
Figure 2B:
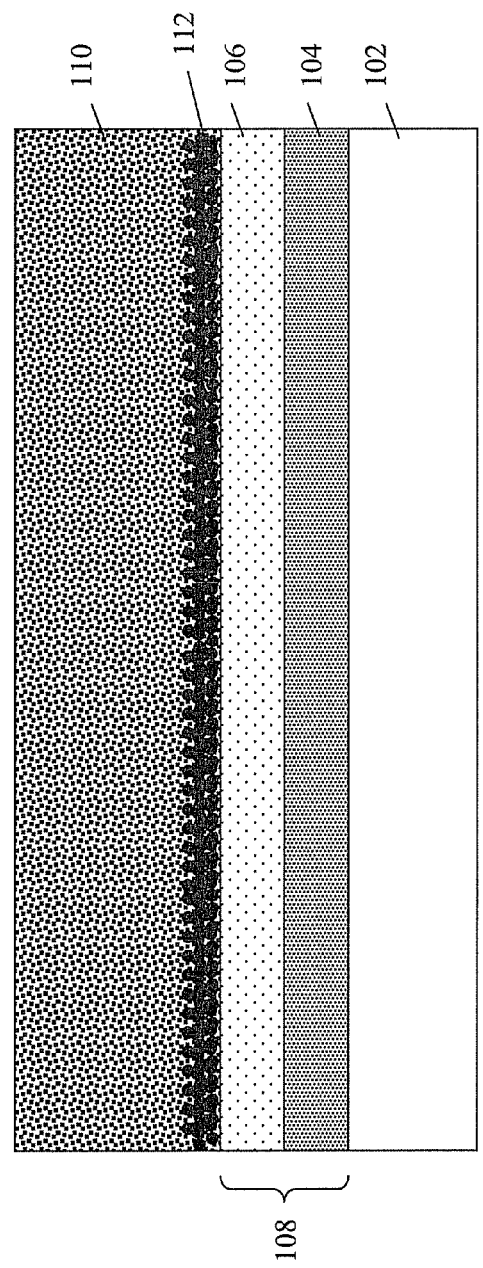
Figure 2C:
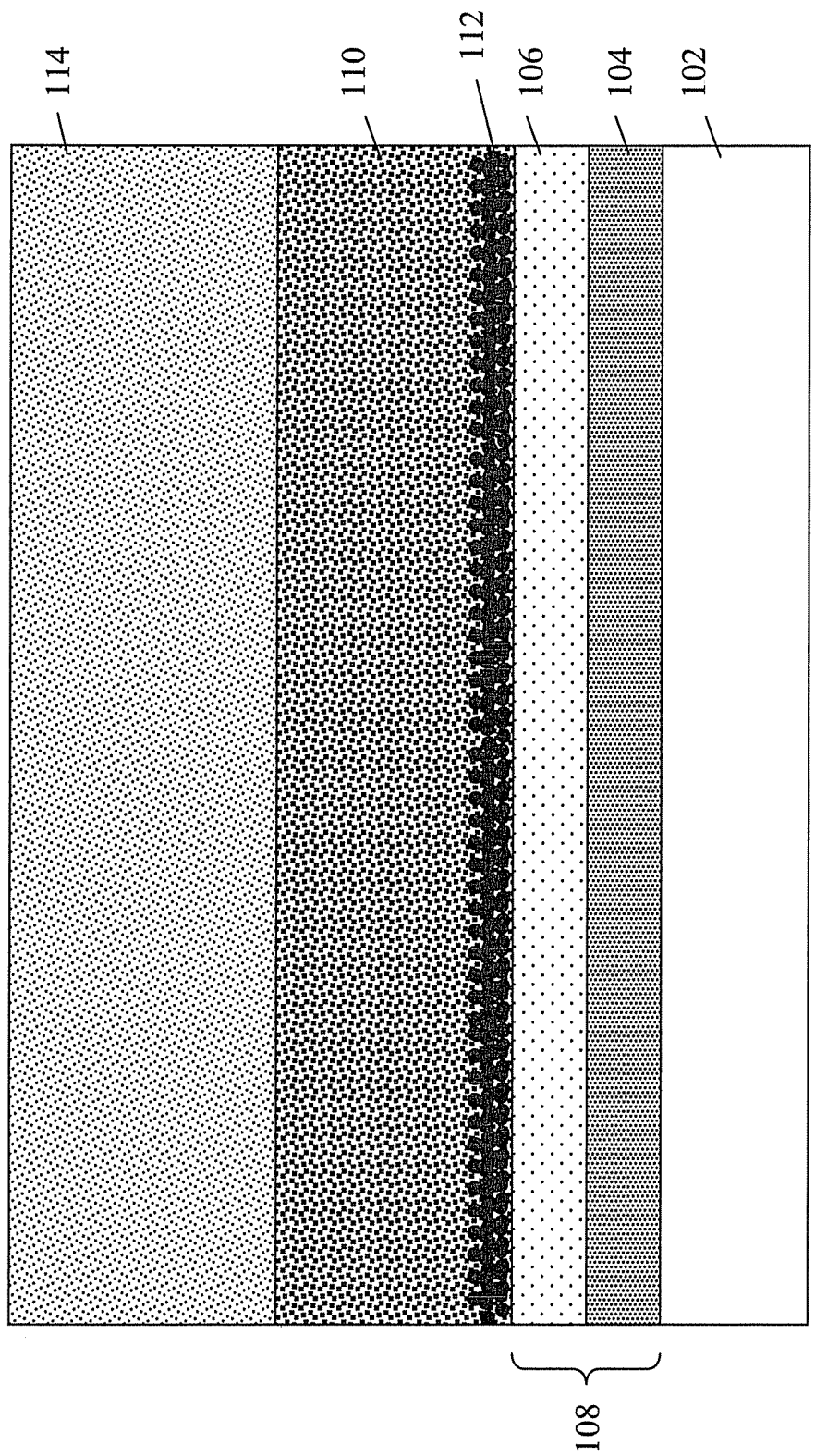
Figure 2D:
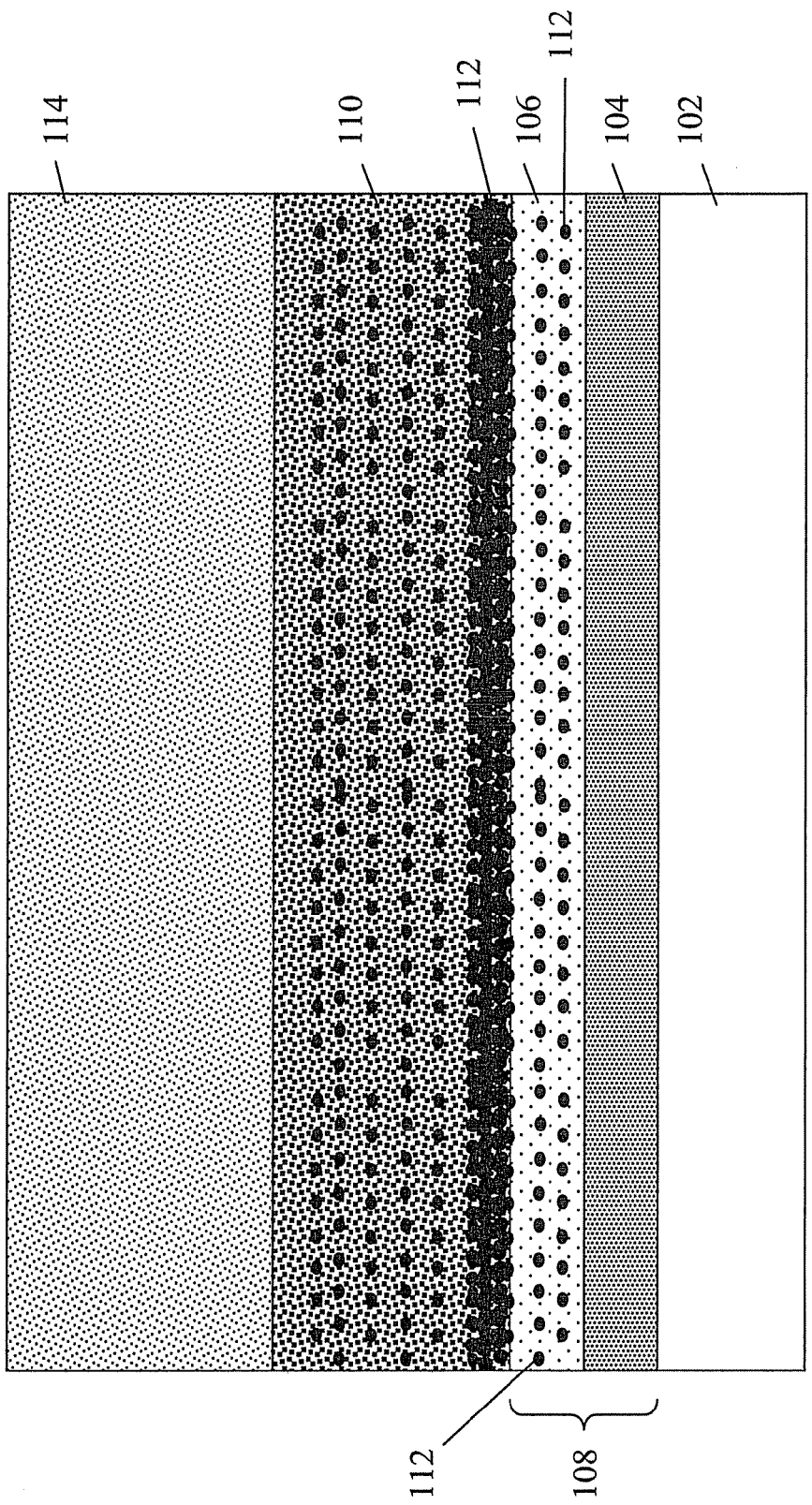

In the above described embodiment, the dopant species 112 is depicted as being deposited after formation of the high-k layer 110. However, other alternatives are also possible. For example, as shown in the process flow sequence of FIGS. 2(a) through 2(d), the formation of the dopant species 112 may precede the formation of the high-k layer 110. In FIG. 2(a), the dopant species is 112 deposited after formation of the nitrogen deficient second dielectric layer 106, followed by formation of the high-k dielectric layer 110, as shown in FIG. 2(b). Then, FIG. 2(c) illustrates formation of the metal gate conductor layer(s) 114 and any associated capping layers (not shown) over the high-k layer 110. Finally, an anneal is performed in FIG. 2(d) to drive the dopant species 112 into the nitrogen deficient second dielectric layer 106, but not within the nitrogen rich first dielectric layer 104. In still a further contemplated embodiment, the dopant species 112 may be deposited concurrently with the formation of the high-k layer 110.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A gate stack structure for field effect transistor (FET) devices, comprising:
    a nitrogen rich first dielectric layer formed over a semiconductor substrate surface;
    a nitrogen deficient, oxygen rich second dielectric layer formed on the nitrogen rich first dielectric layer, the first and second dielectric layers forming, in combination, a bi-layer interfacial layer;
    a high-k dielectric layer formed over the bi-layer interfacial layer, wherein both the nitrogen rich first dielectric layer and the nitrogen deficient, oxygen rich second dielectric layer comprising the bi-layer interfacial layer have a lower dielectric constant than the high-k dielectric layer;
    a metal gate conductor layer formed over the high-k dielectric layer; and
    a work function adjusting dopant species diffused within the high-k dielectric layer and beyond the high-k dielectric layer and into the nitrogen deficient, oxygen rich second dielectric layer disposed below the high-k dielectric layer, and wherein the nitrogen rich first dielectric layer serves to separate the work function adjusting dopant species from the semiconductor substrate surface.

2. The structure of claim 1, wherein the work function adjusting dopant species comprises a lanthanide series metal.

3. The structure of claim 1, wherein the work function adjusting dopant species comprises one or more of: lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and hafnium (Hf).

4. The structure of claim 1, wherein the nitrogen rich first dielectric layer comprises one or more of silicon nitride (SiN) and silicon oxynitride (SiON).

5. The structure of claim 1, wherein the nitrogen deficient, oxygen rich second dielectric layer comprises one of an ozone layer and an oxide layer.

6. The structure of claim 1, wherein the high-k dielectric layer has a dielectric constant of about 4.0 or higher.

7. The structure of claim 1, wherein the high-k dielectric layer has a dielectric constant of about 7.0 or higher.

8. The structure of claim 6, wherein the high-k dielectric layer comprises one or more of: hafnium oxide ($HfO_2$), hafnium orthosilicate ($HfSiO_4$), zirconium dioxide ($ZrO_2$), aluminum oxide ($Al_2O_3$), titanium dioxide ($TiO_2$), lanthanum oxide ($La_2O_3$), strontium titanate ($SrTiO_3$), lanthanum aluminate ($LaAlO_3$), cerium oxide ($CeO_2$), yttrium oxide ($Y_2O_3$) and combinations thereof.

9. The structure of claim 1, wherein the metal gate conductor layer comprises one or more of: tungsten (W), tantalum (Ta), aluminum (Al), ruthenium (Ru), platinum (Pt), etc, or any electrically conductive compound including, but not limited to titanium nitride (TiN), tantalum nitride (TaN), nickel silicide (NiSi), nickel-platinum silicide (NiPtSi), titanium nitride (TiN), tantalum nitride (TaN), titanium carbide (TiC), tantalum carbide (TaC), tantalum carbide oxynitride (TaCNO), ruthenium oxide ($RuO_2$), and combinations thereof.

10. The structure of claim 1, wherein the substrate comprises one or more of: silicon (Si), germanium (Ge), silicon germanium (SiGe), silicon carbide (SiC), silicon germanium carbide (SiGeC), gallium arsenide (GaAs), gallium nitride (GaN), indium arsenide (InAs), and indium phosphide (InP).

11. A high-k metal gate stack structure for field effect transistor (FET) devices, comprising:
    a nitrogen rich first dielectric layer formed over a semiconductor substrate surface;
    a nitrogen deficient, oxygen rich second dielectric layer formed on the nitrogen rich first dielectric layer, the first and second dielectric layers forming, in combination, a bi-layer interfacial layer;
    a hafnium based, high-k dielectric layer formed over the bi-layer interfacial layer, wherein both the nitrogen rich first dielectric layer and the nitrogen deficient, oxygen rich second dielectric layer comprising the bi-layer interfacial layer have a lower dielectric constant than the hafnium based high-k dielectric layer;
    a metal gate conductor layer formed over the high-k dielectric layer; and
    a lanthanum dopant species diffused within the high-k dielectric layer and beyond the high-k dielectric layer and into the nitrogen deficient, oxygen rich second dielectric layer disposed below the high-k dielectric layer, forming a high-k lanthanum oxide therein, and wherein the nitrogen rich first dielectric layer serves to separate the high-k lanthanum oxide from the semiconductor substrate surface.

12. The structure of claim 11, wherein the nitrogen rich first dielectric layer comprises one or more of silicon nitride (SiN) and silicon oxynitride (SiON).

13. The structure of claim 11, wherein the nitrogen deficient, oxygen rich second dielectric layer comprises one of an ozone layer and an oxide layer.

14. The structure of claim 11, wherein the high-k dielectric layer has a dielectric constant of about 7.0 or higher.

15. The structure of claim 14, wherein the high-k dielectric layer comprises one or more of: hafnium oxide ($HfO_2$) and hafnium orthosilicate ($HfSiO_4$).

16. The structure of claim 11, wherein the metal gate conductor layer comprises one or more of: tungsten (W), tantalum (Ta), aluminum (Al), ruthenium (Ru), platinum (Pt), etc, or any electrically conductive compound including, but not limited to titanium nitride (TiN), tantalum nitride (TaN), nickel silicide (NiSi), nickel-platinum silicide (NiPtSi), titanium nitride (TiN), tantalum nitride (TaN), titanium carbide (TiC), tantalum carbide (TaC), tantalum carbide oxynitride (TaCNO), ruthenium oxide ($RuO_2$), and combinations thereof.

17. The structure of claim 11, wherein the substrate comprises one or more of: silicon (Si), germanium (Ge), silicon germanium (SiGe), silicon carbide (SiC), silicon germanium carbide (SiGeC), gallium arsenide (GaAs), gallium nitride (GaN), indium arsenide (InAs), and indium phosphide (InP).

18. A method of forming gate stack structure for field effect transistor (FET) devices, the method comprising:
    forming a nitrogen rich first dielectric layer over a semiconductor substrate surface;

forming a nitrogen deficient, oxygen rich second dielectric layer on the nitrogen rich first dielectric layer, the first and second dielectric layers defining, in combination, a bi-layer interfacial layer;

forming a high-k dielectric layer over the bi-layer interfacial layer, wherein both the nitrogen rich first dielectric layer and the nitrogen deficient, oxygen rich second dielectric layer comprising the bi-layer interfacial layer have a lower dielectric constant than the high-k dielectric layer;

forming a metal gate conductor layer over the high-k dielectric layer; and diffusing a work function adjusting dopant species within the high-k dielectric layer and beyond the high-k dielectric layer and into the nitrogen deficient, oxygen rich second dielectric layer disposed below the high-k dielectric layer, and wherein the nitrogen rich first dielectric layer serves to separate the work function adjusting dopant species from the semiconductor substrate surface.

19. The method of claim 18, wherein the work function adjusting dopant species comprises a lanthanide series metal.

20. The method of claim 18, wherein the work function adjusting dopant species comprises one or more of: lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and hafnium (Hf).

21. The method of claim 18, wherein the nitrogen rich first dielectric layer comprises one or more of silicon nitride (SiN) and silicon oxynitride (SiON).

22. The method of claim 18, wherein the nitrogen deficient, oxygen rich second dielectric layer comprises one of an ozone layer and an oxide layer.

23. The method of claim 18, wherein the high-k dielectric layer has a dielectric constant of about 4.0 or higher.

24. The structure of claim 11, wherein the nitrogen rich first dielectric layer comprises one or more of silicon nitride (SiN) and silicon oxynitride (SiON).

25. The method of claim 23, wherein the high-k dielectric layer comprises one or more of: hafnium oxide ($HfO_2$), hafnium orthosilicate ($HfSiO_4$), zirconium dioxide ($ZrO_2$), aluminum oxide ($Al_2O_3$), titanium dioxide ($TiO_2$), lanthanum oxide ($La_2O_3$), strontium titanate ($SrTiO_3$), lanthanum aluminate ($LaAlO_3$), cerium oxide ($CeO_2$), yttrium oxide ($Y_2O_3$) and combinations thereof.

26. The method of claim 18, wherein the metal gate conductor layer comprises one or more of: tungsten (W), tantalum (Ta), aluminum (Al), ruthenium (Ru), platinum (Pt), etc, or any electrically conductive compound including, but not limited to titanium nitride (TiN), tantalum nitride (TaN), nickel silicide (NiSi), nickel-platinum silicide (NiPtSi), titanium nitride (TiN), tantalum nitride (TaN), titanium carbide (TiC), tantalum carbide (TaC), tantalum carbide oxynitride (TaCNO), ruthenium oxide ($RuO_2$), and combinations thereof.

27. The method of claim 18, wherein the substrate comprises one or more of: silicon (Si), germanium (Ge), silicon germanium (SiGe), silicon carbide (SiC), silicon germanium carbide (SiGeC), gallium arsenide (GaAs), gallium nitride (GaN), indium arsenide (InAs), and indium phosphide (InP).

28. The method of claim 18, further comprises depositing the work function adjusting dopant species after forming the high-k dielectric layer.

29. The method of claim 18, further comprises depositing the work function adjusting dopant species prior to forming the high-k dielectric layer.

30. The method of claim 18, further comprises depositing the work function adjusting dopant species concurrently with forming the high-k dielectric layer.

* * * * *